US012658884B2

(12) United States Patent
Dyer et al.

(10) Patent No.: US 12,658,884 B2
(45) Date of Patent: Jun. 16, 2026

(54) TRANSVERSELY-EXCITED FILM BULK ACOUSTIC RESONATOR FOR REDUCED YX-CUT PIEZOELECTRIC COUPLING

(71) Applicant: Murata Manufacturing Co., Ltd., Nagaokakyo (JP)

(72) Inventors: Greg Dyer, San Francisco, CA (US); Filip Iliev, San Francisco, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 520 days.

(21) Appl. No.: 18/159,904

(22) Filed: Jan. 26, 2023

(65) Prior Publication Data

US 2023/0246631 A1     Aug. 3, 2023

Related U.S. Application Data

(60) Provisional application No. 63/306,470, filed on Feb. 3, 2022.

(51) Int. Cl.
| | |
|---|---|
| *H03H 9/17* | (2006.01) |
| *H03H 9/02* | (2006.01) |
| *H03H 9/13* | (2006.01) |
| *H03H 9/56* | (2006.01) |

(52) U.S. Cl.
CPC ........ *H03H 9/173* (2013.01); *H03H 9/02031* (2013.01); *H03H 9/133* (2013.01); *H03H 9/564* (2013.01)

(58) Field of Classification Search
CPC .. H03H 9/02; H03H 9/13; H03H 9/17; H03H 9/25; H03H 9/54; H03H 9/64
See application file for complete search history.

(56) References Cited

U.S. PATENT DOCUMENTS

| | | | |
|---|---|---|---|
| 5,705,399 | A | 1/1998 | Larue |
| 5,853,601 | A | 12/1998 | Krishaswamy et al. |
| 6,540,827 | B1 | 4/2003 | Levy et al. |
| 6,707,229 | B1 | 3/2004 | Martin |
| 7,463,118 | B2 | 12/2008 | Jacobsen |
| 7,535,152 | B2 | 5/2009 | Ogami et al. |

(Continued)

FOREIGN PATENT DOCUMENTS

| | | |
|---|---|---|
| WO | 2016017104 | 2/2016 |
| WO | 2018003273 A1 | 1/2018 |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Andrea Lindgren Baltzell
*Assistant Examiner* — Alan Wong
(74) *Attorney, Agent, or Firm* — ArentFox Schiff LLP

(57) ABSTRACT

A filter may include a substrate and a rotated YX-cut piezoelectric plate coupled to the substrate. The filter also may include an interdigital transducer (IDT) formed on a portion of the rotated YX-cut piezoelectric plate forming a diaphragm that spans a cavity between the rotated YX-cut piezoelectric plate and the substrate. The IDT includes interleaved fingers that are disposed on the diaphragm. The IDT has an aperture that is less than or equal to 4 times a pitch of the interleaved fingers.

18 Claims, 12 Drawing Sheets

(56) References Cited

U.S. PATENT DOCUMENTS

| | | | |
|---|---|---|---|
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,278,802 B1 | 10/2012 | Lee et al. | |
| 8,344,815 B2 | 1/2013 | Yamanaka | |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,306,539 B2* | 4/2016 | Inoue | H03H 9/6433 |
| 9,369,105 B1 | 6/2016 | Li | |
| 9,425,765 B2 | 8/2016 | Rinaldi | |
| 9,525,398 B1 | 12/2016 | Olsson | |
| 9,564,873 B2* | 2/2017 | Kadota | H03H 9/02015 |
| 9,634,226 B2* | 4/2017 | Takahashi | H03H 9/059 |
| 9,748,923 B2 | 8/2017 | Kando et al. | |
| 9,780,759 B2* | 10/2017 | Kimura | H03H 9/02228 |
| 10,200,013 B2 | 2/2019 | Bower et al. | |
| 10,491,192 B1* | 11/2019 | Plesski | H03H 9/02228 |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2* | 9/2020 | Yantchev | H03H 9/02062 |
| 10,797,675 B2 | 10/2020 | Plesski | |
| 10,826,462 B2 | 11/2020 | Plesski et al. | |
| 11,451,212 B2* | 9/2022 | Komatsu | H03H 9/6406 |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0261250 A1 | 12/2004 | Kadota et al. | |
| 2006/0125489 A1 | 6/2006 | Feucht et al. | |
| 2006/0222568 A1 | 10/2006 | Wang et al. | |
| 2007/0194863 A1 | 8/2007 | Shibata et al. | |
| 2010/0064492 A1 | 3/2010 | Tanaka | |
| 2010/0123367 A1 | 5/2010 | Tai et al. | |
| 2011/0109196 A1 | 5/2011 | Goto | |
| 2011/0278993 A1 | 11/2011 | Iwamoto | |
| 2013/0015353 A1 | 1/2013 | Tai et al. | |
| 2013/0234805 A1 | 9/2013 | Takahashi | |
| 2013/0321100 A1 | 12/2013 | Wang | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2017/0370791 A1 | 12/2017 | Nakamura et al. | |
| 2018/0123016 A1 | 5/2018 | Gong et al. | |
| 2018/0191322 A1 | 7/2018 | Chang et al. | |
| 2019/0068164 A1 | 2/2019 | Houlden et al. | |
| 2019/0131953 A1 | 5/2019 | Gong | |
| 2019/0273480 A1 | 9/2019 | Lin | |

OTHER PUBLICATIONS

R. Olsson III, K. Hattar et al. "A high electromechanical coupling coefficient SHO Lamb wave lithiumniobate micromechanical resonator an da method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y—cut X—propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

* cited by examiner

DETAIL C

DETAIL C'

DETAIL C"

DETAIL C'''

SECTION A-A

315

310

324

322

320

340

SECTION A-A

TRANSVERSELY-EXCITED FILM BULK ACOUSTIC RESONATOR FOR REDUCED YX-CUT PIEZOELECTRIC COUPLING

CROSS REFERENCE TO RELATED APPLICATIONS

This application claims priority to U.S. Patent Provisional Application No. 63/306,470, filed Feb. 3, 2022, the entire contents of which are hereby incorporated by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. Radio access technology for mobile telephone networks has been standardized by the 3GPP (3rd Generation Partnership Project). Radio access technology for 5th generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

SUMMARY OF THE INVENTION

In some aspects, the techniques described herein relate to a filter, including a plurality of acoustic resonators; and a cross-coupling capacitor connected to ground, the cross-coupling capacitor bisecting a series connection between at least two acoustic resonators of the plurality of acoustic resonators.

In some aspects, the techniques described herein relate to an acoustic resonator device that includes a substrate; a rotated YX-cut piezoelectric plate coupled to the substrate and including a diaphragm that spans a cavity; and an interdigital transducer (IDT) including interleaved fingers at the diaphragm of the rotated YX-cut piezoelectric plate. In this aspect, the IDT has an aperture that is less than or equal to 4 times a pitch of the interleaved fingers.

In some aspects, the techniques described herein relate to a filter that includes a substrate having a surface; a Y-rotated piezoelectric plate attached to the surface of the substrate except for a portion of the Y-rotated piezoelectric plate that comprises a diaphragm that spans a cavity; and an interdigital transducer (IDT) including interleaved fingers at the diaphragm of the rotated Y-rotated piezoelectric plate. In this aspect, the IDT has an aperture that is less than or equal to 4 times a pitch of the interleaved fingers.

In some aspects, the techniques described herein relate to a filter that includes a substrate; a rotated YX-cut piezoelectric plate attached to at least a portion of a surface of the substrate; and an interdigital transducer (IDT) comprising interleaved fingers at at least a portion of the rotated YX-cut piezoelectric plate that spans a cavity between the rotated YX-cut piezoelectric plate and the substrate. In this aspect, the IDT has a distance between a plurality of busbars of the IDT that is less than or equal to 4 times a pitch of the interleaved fingers.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplarily pointed out in the claims.

Figure 1:
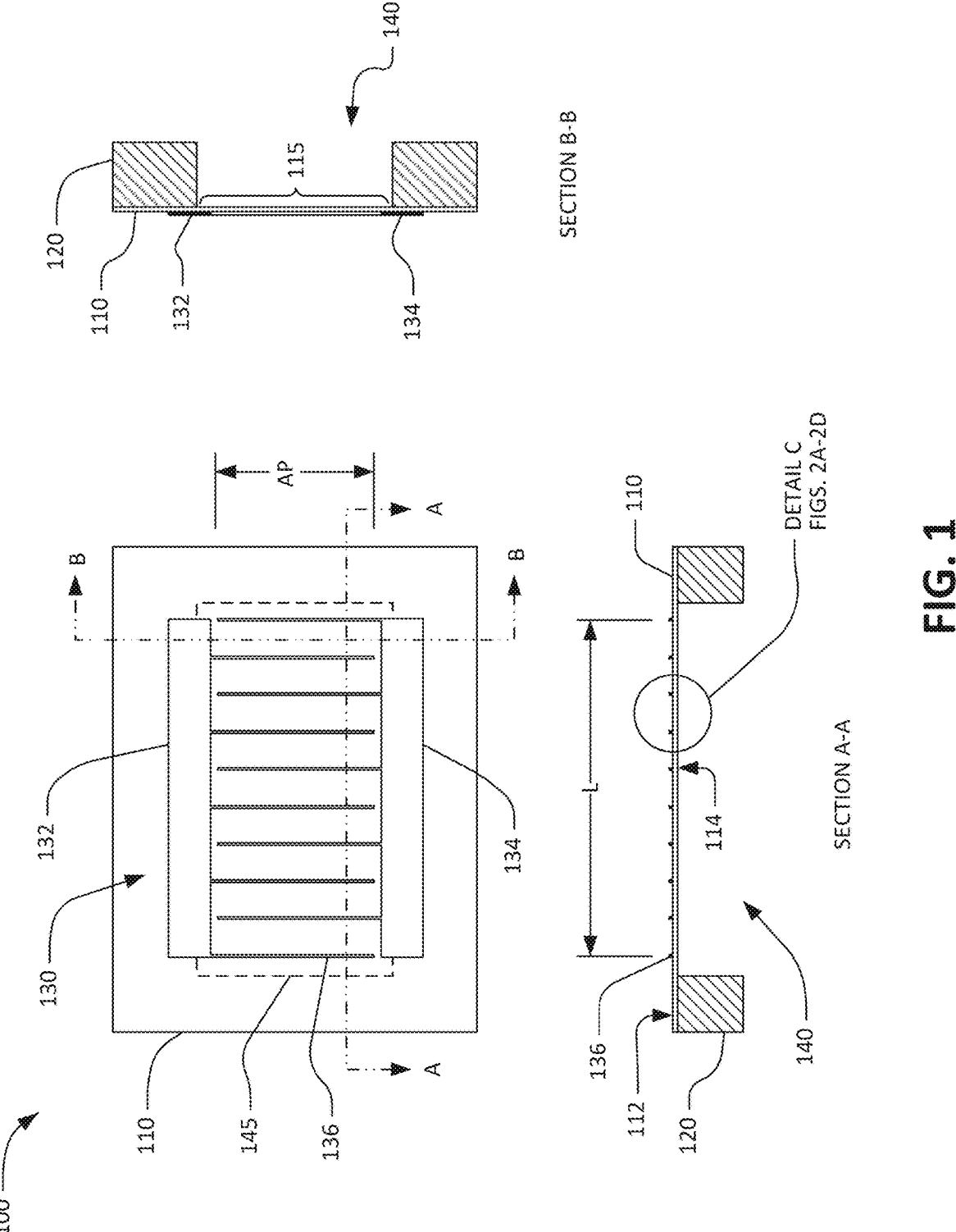
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

A Shear-Mode Film Transversely-Excited Film Bulk Acoustic Resonator (XBAR) is a resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator includes an IDT formed on a thin floating layer, or diaphragm, of a piezoelectric material. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A radio frequency (RF) filter may incorporate multiple XBAR devices connected as a conventional ladder filter circuit. A ladder filter circuit includes one or more series resonator connected in series between an input and an output of the filter and one or more shunt resonators, each connected between ground and one of the input, the output, or a node between two series resonators. Each resonator has a resonance frequency where the admittance of the resonator approaches that of a short circuit, and an anti-resonance frequency where the admittance of the resonator approaches that of an open circuit. In a typical ladder band-pass filter circuit, the resonant frequencies of shunt resonators are located below a lower edge of a passband of the filter and the resonant frequencies of series resonators are located in the passband.

Acoustic resonators may be fabricated on a piezoelectric material, such as lithium niobate. Lithium niobate has a unique combination of properties that makes it well-suited for use in acoustic resonators. The material has a high piezoelectric coefficient, which means that it generates a large electrical output when it is mechanically deformed. Additionally, it has a high acoustic velocity, which allows it to generate sound waves with high frequency and high power. XBARs may be fabricated on a variety of piezoelectric materials and crystal orientations including Z-cut and rotated YX-cut lithium niobate. Rotated YX-cut lithium niobate has advantages over Z-cut lithium niobate including higher electromechanical coupling, lower losses and fewer spurious modes. However, the electromechanical coupling of YX-cut lithium niobate can be too large for some applications. For instance, the high coupling between resonators makes designing narrow filters increasingly more difficult for filters operating in the n79 band and 5 GHz frequencies.

The subject technology provides several advantages over other approaches used to reduce acoustic coupling in filter designs for high-frequency applications. For example, reducing the aperture causes a decrease in the layout footprint of the resonators, which in turn helps improve the mechanical reliability of XBARs by helping reduce the bowing of the piezoelectric membrane. In another example, the amount of loss realized with a narrower aperture or at least between different apertures of decreasing size is relatively insignificant.

Description of Apparatus

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on one or both surfaces of a piezoelectric plate 110 having parallel front and back surfaces 112, 114, respectively (also referred to generally first and second surfaces, respectively). The piezoelectric plate is a thin single-crystal layer of a piezoelectric material such as lithium niobate, lithium tantalite, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations including rotated Z-cut and rotated YX-cut.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A and FG. 3B). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, referred to as the "aperture" of the IDT for purposes of this disclosure. The center-to-center distance L between the outermost fingers of the IDT 130 is the "length" of the IDT.

Figure 3A:
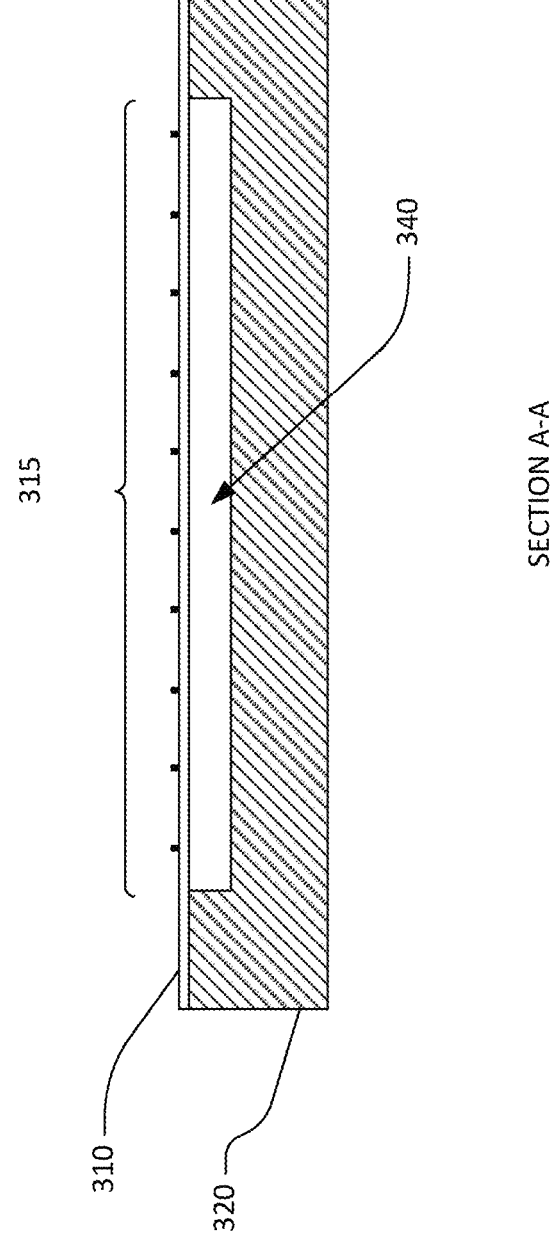
FIG. 3A is an alternative schematic cross-sectional view of the XBAR of FIG. 1.
Figure 3B:
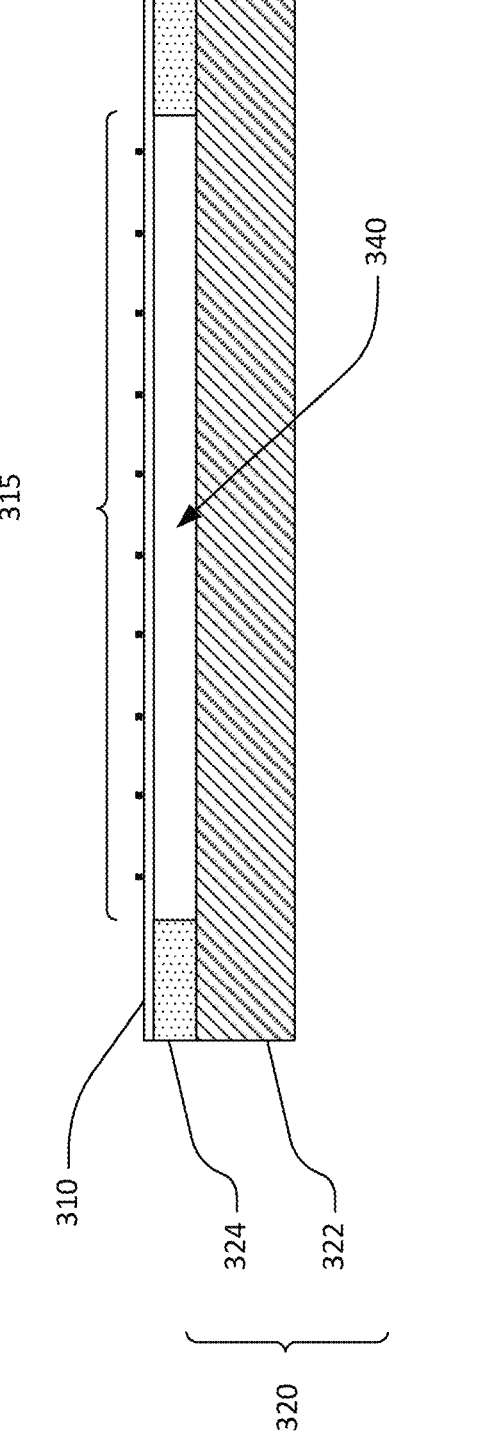
FIG. 3B is an alternative schematic cross-sectional view of the XBAR of FIG. 1.
Figure 3B:

In the examples of FIG. 1, FIG. 3A. and FIG. 3B, the IDT 130 is on the front surface 112 of the piezoelectric plate 110. In other configurations, the IDT 130 may be on the back surface 114 of the piezoelectric plate 110 or on both the front and back surfaces 112, 114.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular cross section with an extent greater than the aperture AP and length L of the IDT 130. A cavity of an XBAR may have a different cross-sectional shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT. An XBAR may have hundreds, possibly thousands, of parallel fingers in the IDT. Similarly, the thickness of the fingers in the cross-sectional views is greatly exaggerated.

Figure 2A:
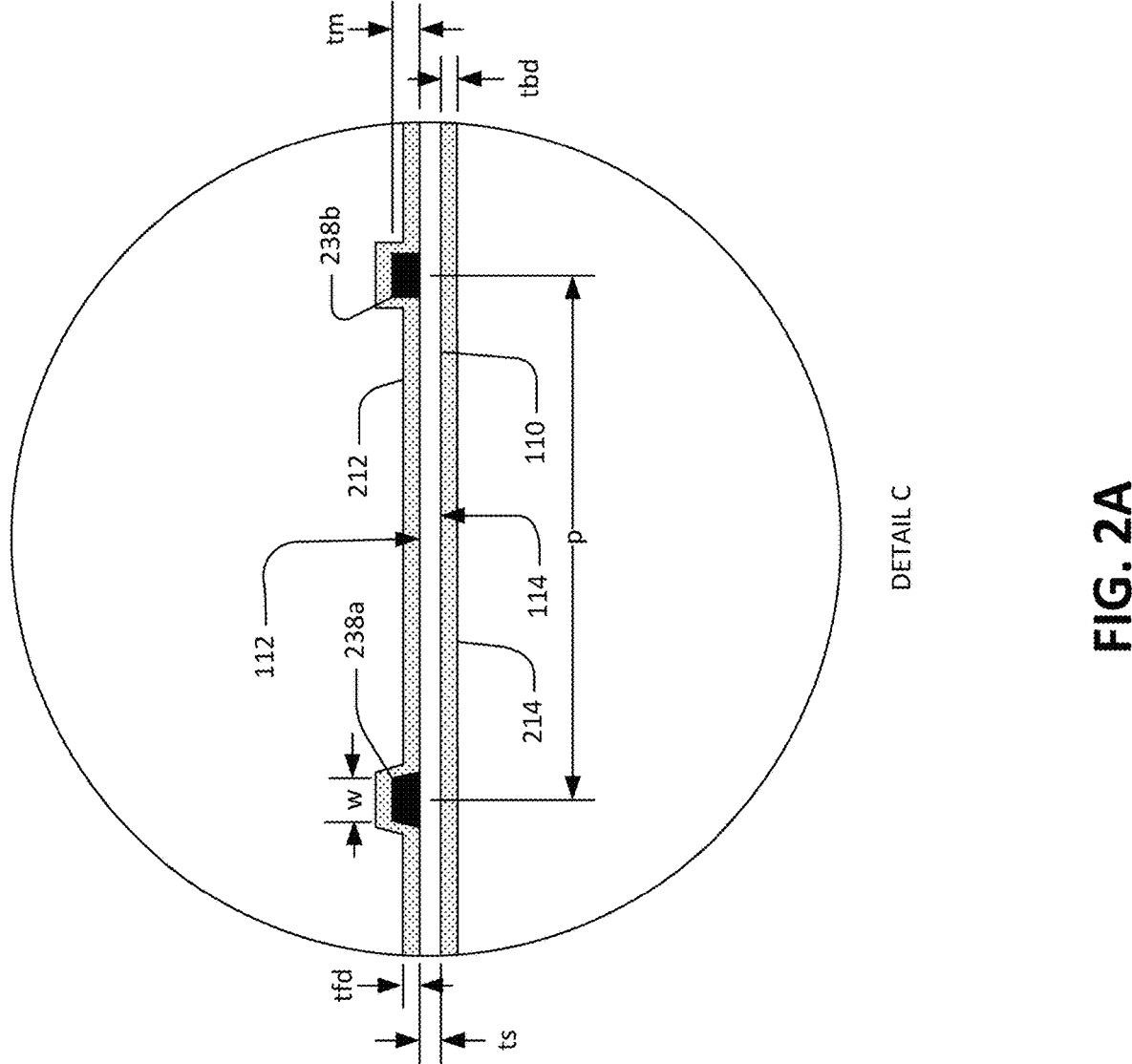
FIG. 2A is an expanded schematic cross-sectional view of a portion of the XBAR of FIG. 1.

FIG. 2A shows a detailed schematic cross-sectional view of the XBAR 100 of FIG. 1. The piezoelectric plate 110 is a single-crystal layer of piezoelectrical material having a thickness ts. ts may be, for example, 100 nm to 1500 nm. When used in filters for 5G NR and Wi-Fi™ bands from 3.4 GHZ to 7 GHz, the thickness ts may be, for example, 150 nm to 500 nm.

A front-side dielectric layer 212 may optionally be formed on the front side 112 of the piezoelectric plate 110. The "front side" of the XBAR is, by definition, the surface facing away from the substrate and can be considered a top surface or first surface. The front-side dielectric layer 212 has a thickness tfd. As shown in FIG. 2A the front-side dielectric layer 212 covers the IDT fingers 238a, 238b. Although not shown in FIG. 2A, the front side dielectric layer 212 may also be deposited only between the IDT fingers 238a, 238b. In this case, an additional thin dielectric layer (not shown) may be deposited over the IDT fingers to seal and passivate the fingers.

A back-side dielectric layer 214 may optionally be formed on the back side 114 of the piezoelectric plate 110. The "back side" of the XBAR is, by definition, the surface facing towards the substrate and can be considered a bottom surface or second surface. The back-side dielectric layer 214 has a thickness tbd. The front-side and back-side dielectric layers 212, 214 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 212, 214 are not necessarily the same material. Either or both of the front-side and back-side dielectric layers 212, 214 may be formed of multiple layers of two or more materials.

The IDT fingers 238a, 238b may be aluminum, substantially aluminum alloys, copper, substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. The cross-sectional shape of the IDT fingers may be trapezoidal (finger 238a), rectangular (finger 238b) or some other shape.

Dimension p is the center-to-center spacing between adjacent IDT fingers. The center-to-center spacing may be constant over the length of the IDT, in which case the dimension p may be referred to as the pitch of the IDT and/or the pitch of the XBAR. The center-to-center spacing may vary along the length of the IDT, in which case the pitch of the IDT is the average value of dimension p over the length of the IDT. Each IDT finger has a width w measured normal to the long direction of each finger. The width of the IDT fingers may be constant over the length of the IDT, which case the dimension w is the width of each IDT finger. The width of individual IDT fingers may vary along the length of the IDT 130, in which case dimension w is the average value of the widths of the IDT fingers over the length of the IDT. Note that the pitch p and the width w of the IDT fingers are measured in a direction parallel to the length L of the IDT, as defined in FIG. 1.

The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric plate 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

The resonance frequency of an XBAR is dependent on the total thickness of its diaphragm, including the piezoelectric plate 110, and the front-side and back-side dielectric layers 212, 214. The thickness of one or both dielectric layers may be varied to change the resonance frequencies of various XBARs in a filter. For example, shunt resonators in a ladder filter circuit may incorporate thicker dielectric layers to reduce the resonance frequencies of the shunt resonators relative to series resonators with thinner dielectric layers.

The thickness tfd of the front-side dielectric layer 212 over the IDT fingers 238a, 238b may be greater than or equal to a minimum thickness required to deal and passivate the IDT fingers and other conductors on the front side 112 to the piezoelectric plate 110. The minimum thickness may be, for example, 10 nm to 50 nm depending on the material of the front side dielectric layer and method of deposition.

Figure 2B:
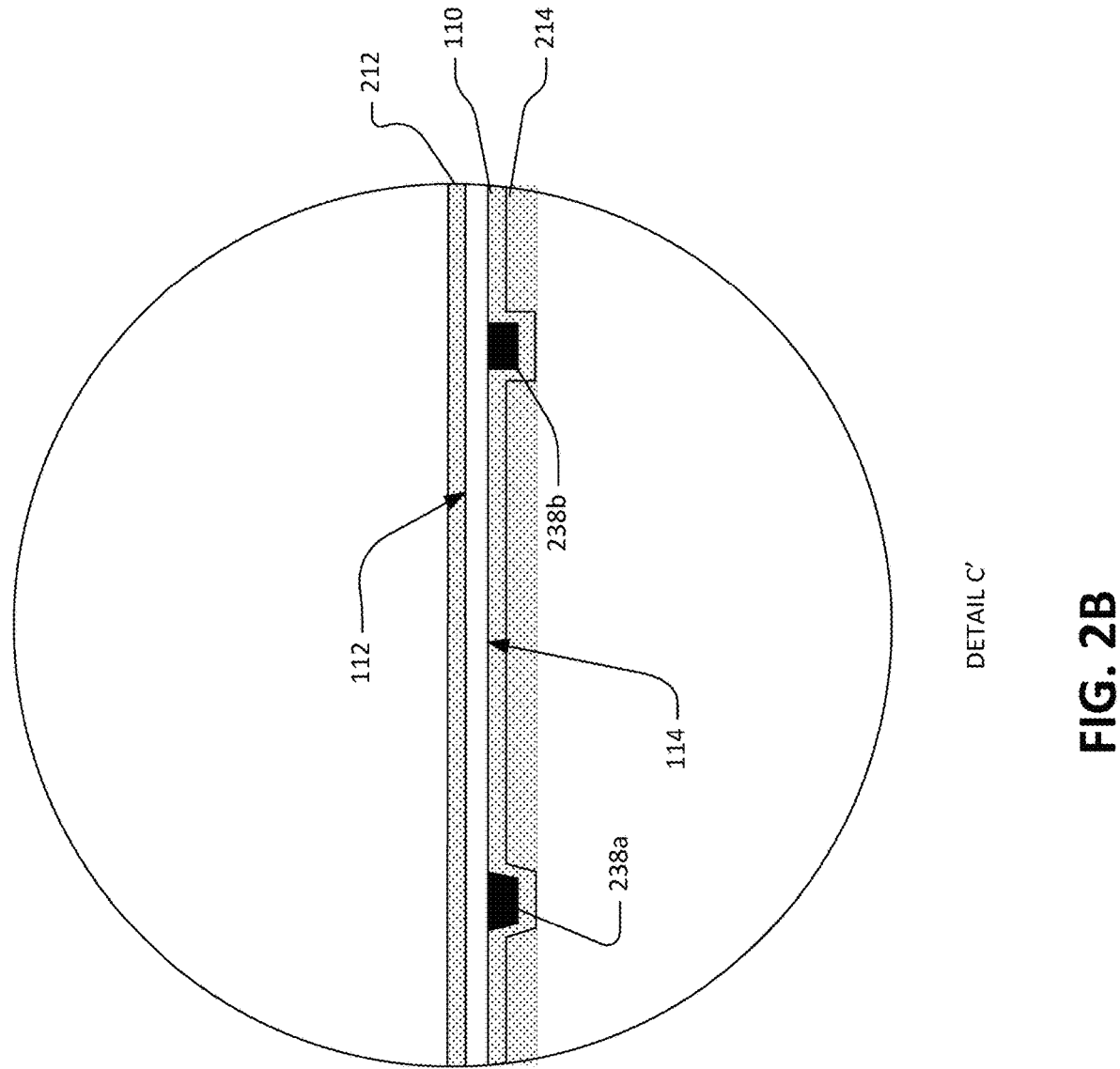
FIG. 2B is an expanded schematic cross-sectional view of an alternative configuration of the XBAR of FIG. 1.

FIG. 2B shows an alternative configuration in which the IDT fingers 238a, 238b are on the back side 114 of the piezoelectric plate 110 and are covered by a back-side dielectric layer 214. A front side dielectric layer 212 may cover the front side 112 of the piezoelectric plate 110.

Figure 2C:
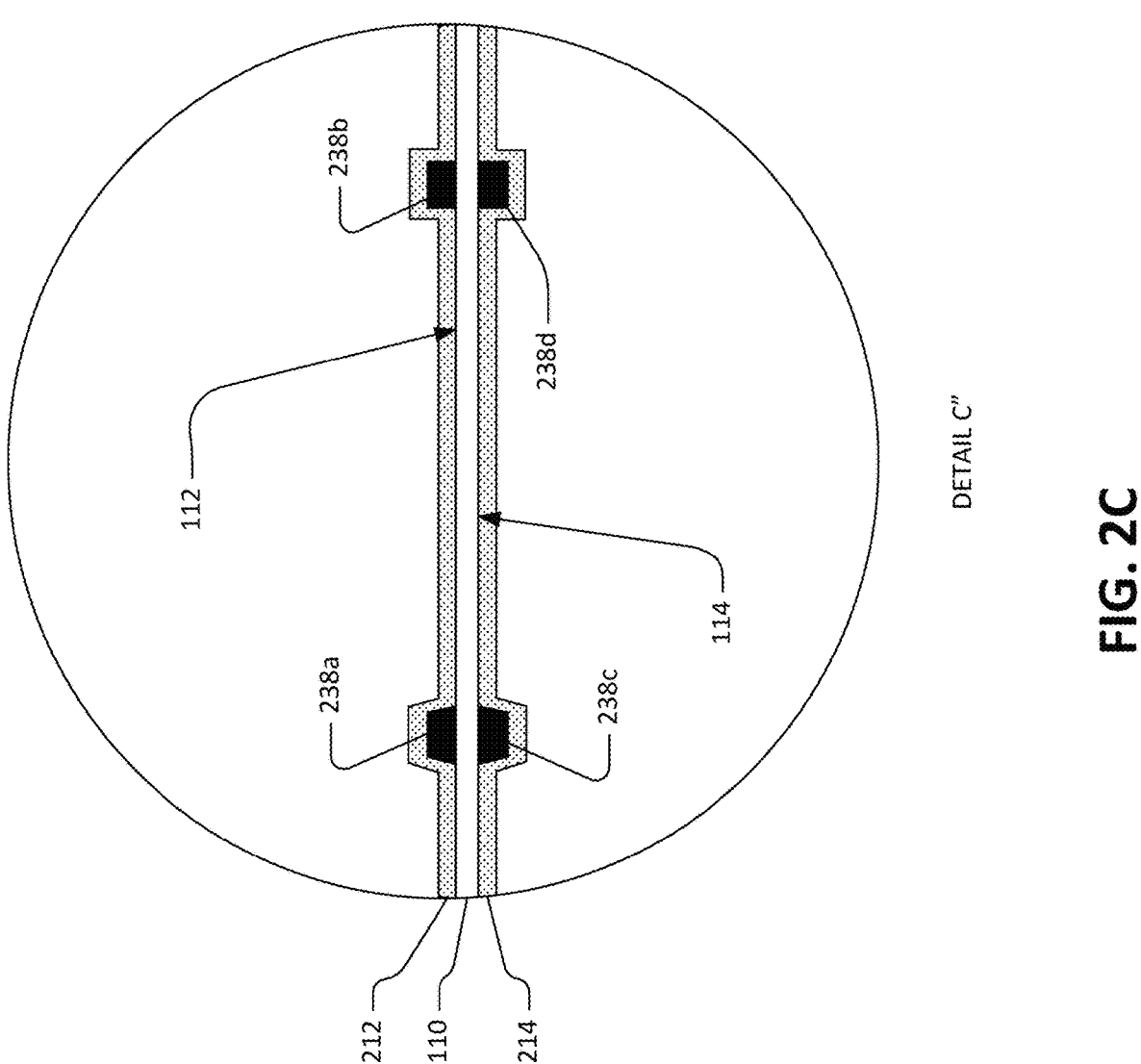
FIG. 2C is an expanded schematic cross-sectional view of another alternative configuration of the XBAR of FIG. 1.

FIG. 2C shows an alternative configuration in which IDT fingers 238a, 238b are on the front side 112 of the piezoelectric plate 110 and are covered by a front-side dielectric layer 212. IDT fingers 238c, 238d are on the back side 114 of the piezoelectric plate 110 and are covered by a back-side dielectric layer 214. As previously described, the front-side and back-side dielectric layer 212, 214 are not necessarily the same thickness or the same material.

Figure 2D:
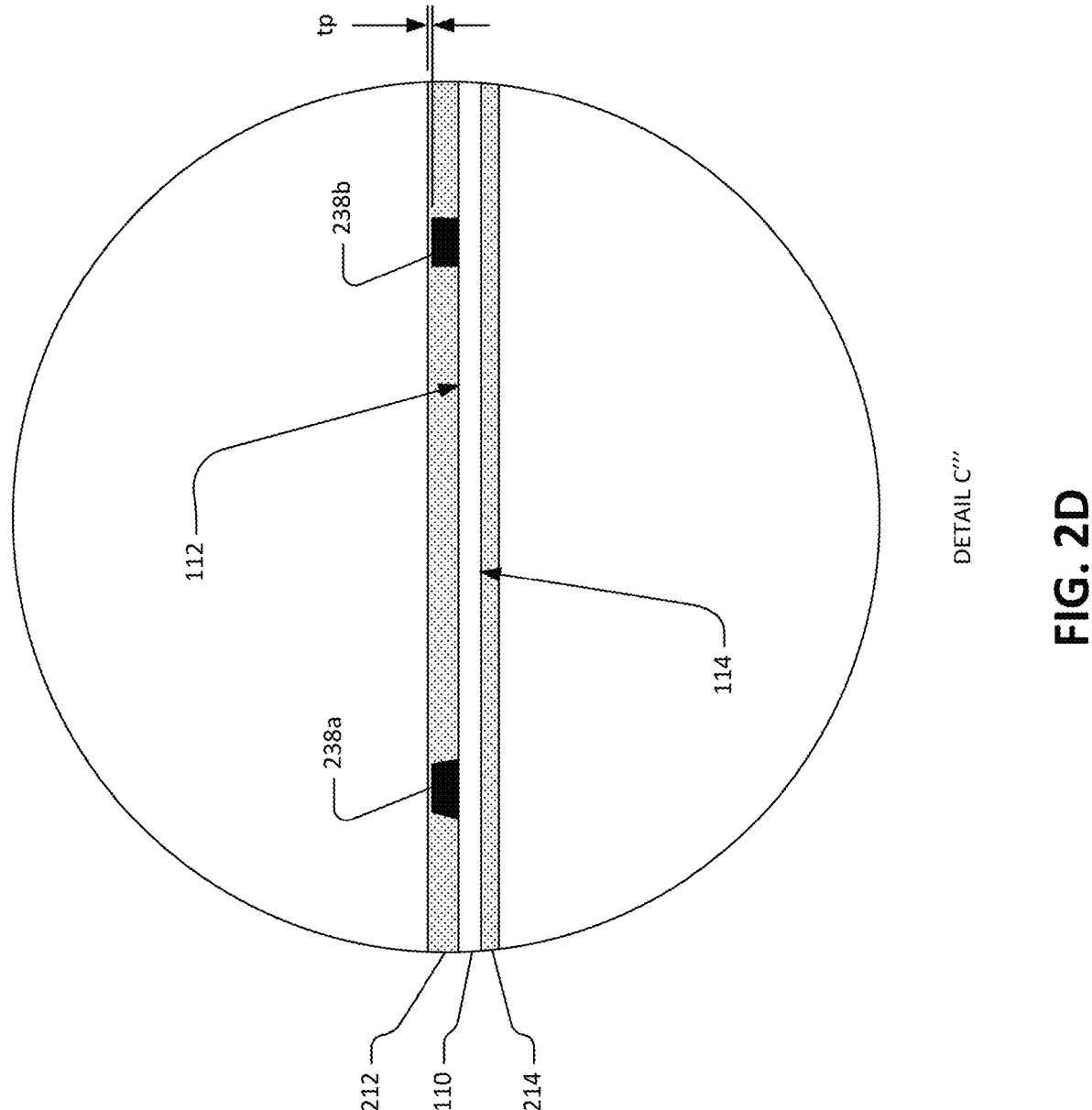
FIG. 2D is an expanded schematic cross-sectional view of another alternative configuration of the XBAR of FIG. 1.

FIG. 2D shows another alternative configuration in which IDT fingers 238a, 238b are on the front side 112 of the piezoelectric plate 110 and are covered by a front-side dielectric layer 212. As further shown, the surface of the front-side dielectric layer is planarized. The front-side dielectric layer may be planarized, for example, by polishing or some other method. A thin layer of dielectric material having a thickness tp may cover the IDT finger 238a, 238b to seal and passivate the fingers. The dimension TP may be, for example, 10 nm to 50 nm. It should be appreciated that the embodiments shown in FIGS. 2C and 2D can be combined in yet another embodiment in which the front-side dielectric layer 212 and the back-side dielectric layer 214 are both planarized.

FIG. 3A and FIG. 3B show two alternative cross-sectional views along the section plane A-A defined in FIG. 1. In FIG.

3A, a piezoelectric plate 310 is attached to a substrate 320. A cavity 340, which does not fully penetrate the substrate 320, is formed in the substrate under the portion of the piezoelectric plate 310 containing the IDT of an XBAR. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings provided in the piezoelectric plate 310.

In FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material (e.g., another dielectric material). Although not shown in FIG. 3B, the substrate 320 may include more than one intermediate layer between the base 322 and the piezoelectric plate 310. A cavity 340 is formed in the intermediate layer 324 under the portion of the piezoelectric plate 310 containing the IDT fingers of an XBAR. The cavity 340 may be formed, for example, by etching the intermediate layer 324 before attaching the piezoelectric plate 310. Alternatively, the cavity 340 may be formed by etching the intermediate layer 324 with a selective etchant that reaches the substrate through one or more openings (not shown) provided in the piezoelectric plate 310. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340. As shown in FIG. 3B, the cavity 340 extends completely through the intermediate layer 324. In other configurations, the cavity 340 may extend into, but not though the intermediate layer 324 (i.e., the intermediate layer 324 may extend over the bottom of the cavity on top of the base 322), or may extend through the intermediate layer 324 into the base 322.

Figure 4:
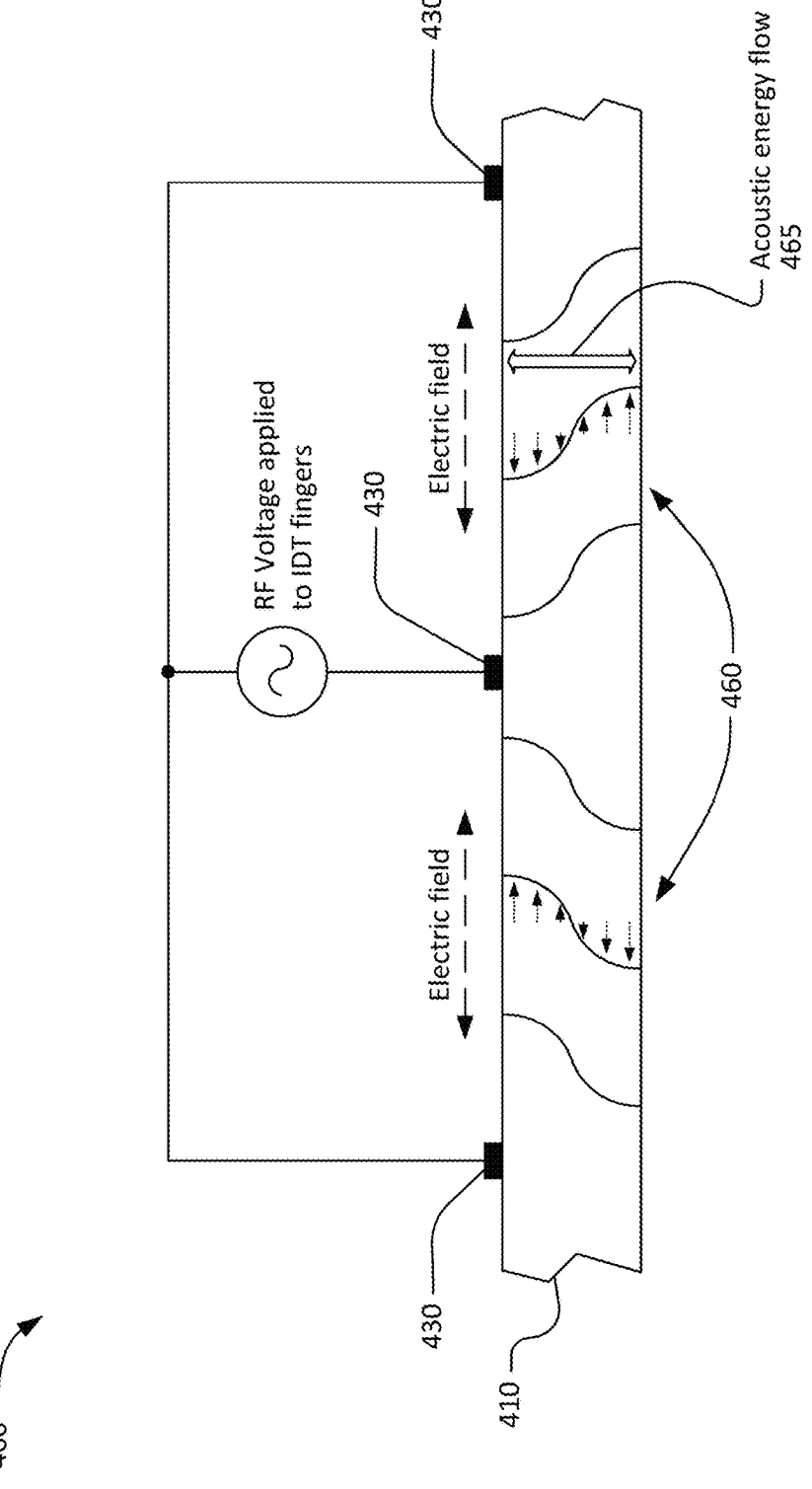
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites a shear-mode acoustic mode, in the piezoelectric plate 410. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve improved performance compared with current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5:
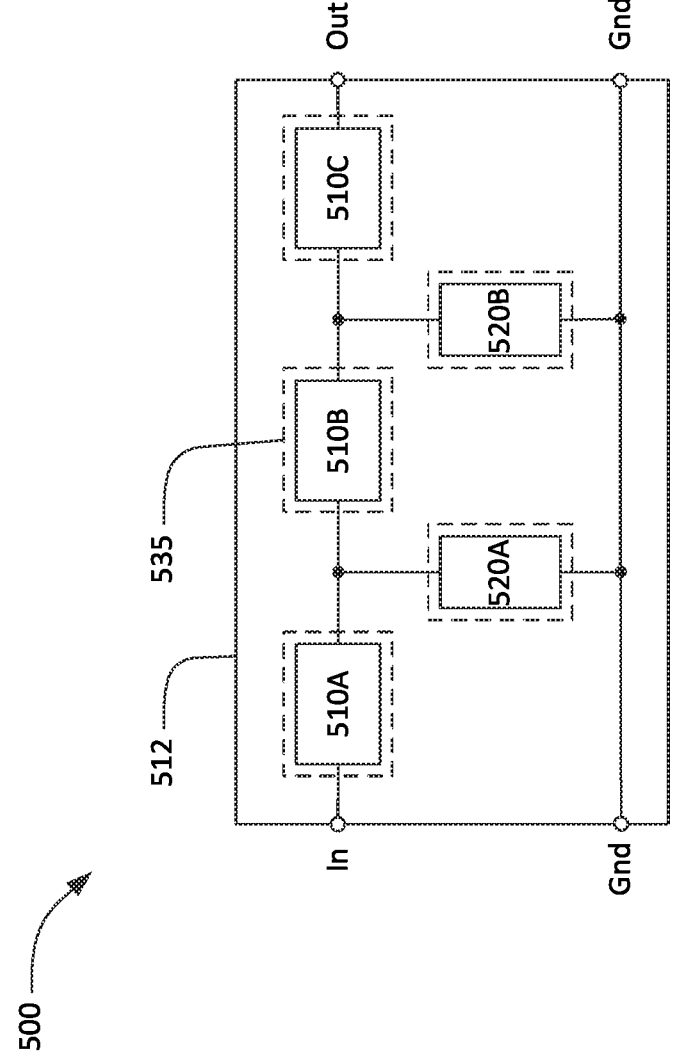
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including three series resonators 510A, 510B, 510C and two shunt resonators 520A, 520B. The three series resonators 510A, 510B, and 510C are connected in series between a first port and a second port. In FIG. 5, the first and second ports are labeled "In" and "Out", respectively. However, the filter 500 is bidirectional and either port and serve as the input or output of the filter. The two shunt resonators 520A, 520B are connected from nodes between the series resonators to ground. All the shunt resonators and series resonators are XBARs on a single die.

The three series resonators 510A, B, C and the two shunt resonators 520A, B of the filter 500 are formed on a single plate 512 of piezoelectric material bonded to a silicon substrate (not visible). The series and shunt resonators all have a bonding layer formed on a single plate of piezoelectric material. The three series resonators 510A, B, C but not the two shunt resonators 520A, B have a single plate of piezoelectric material bonded to the bonding layer. Each resonator includes a respective IDT (not shown), with at least the fingers of the IDT disposed over a cavity in the substrate. In this and similar contexts, the term "respective" means "relating things each to each," which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Figure 6:
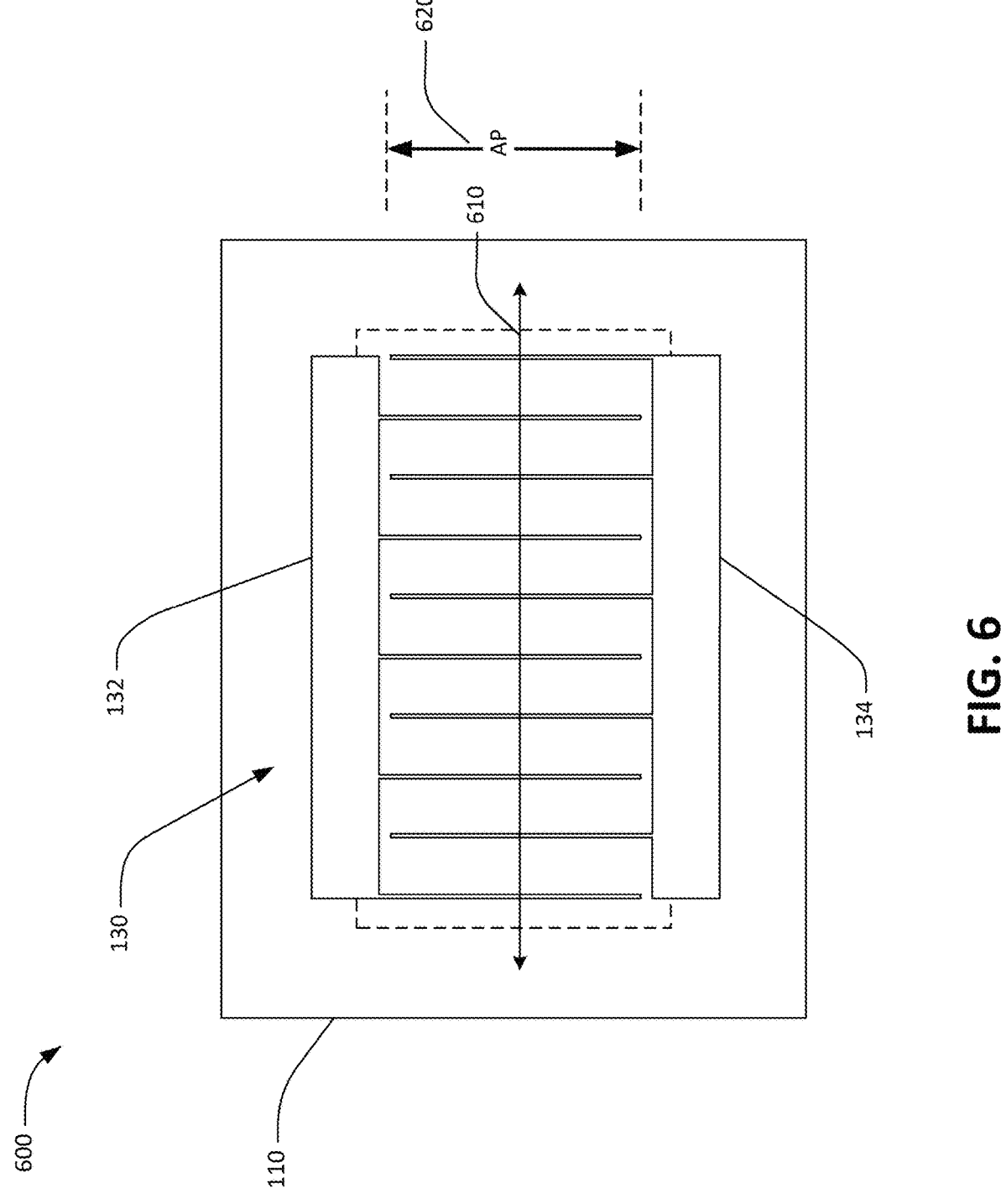
FIG. 6 is a simplified schematic top view of a XBAR.

FIG. 6 is a simplified schematic top view of an XBAR 600 according to an exemplary aspect. In general, Y-rotated lithium niobate, such as 120-yx and 128-yx, has many desirable dispersion characteristics for XBAR resonators. 120-yx cut lithium niobate is a type of crystal that is commonly used in acoustic resonators. The 120-yx cut of lithium niobate and 128-yx cut of lithium niobate are each a specific orientation of the crystal that is provided according to an exemplary aspect to utilize the material's piezoelectric properties. The cut angle (e.g., 120-yx cut, 128-yx cut) is defined by the angles between the crystal axis and the direction of the electric field. The 120-yx cut and/or 128-yx cut can be characterized by high piezoelectric response and high acoustic velocity, which makes each y-rotated cut crystal suitable for high-frequency applications.

In Y-rotated lithium-niobate wave guiding, the acoustic wave 610 (shown for illustration purposes as a straight line in the lengthwise direction) travels along the length L of the IDT 130 at resonant frequency. However, the effective acoustic coupling is too large for certain filter designs, such as band n79 and 5 GHz Wi-Fi operation. Coupling in Y-rotated lithium niobate acoustic resonators may refer to a phenomenon where the mechanical properties of one resonator in the crystal of piezoelectric material can affect the properties of another resonator. This can lead to signal loss and distortion in acoustic communication systems.

To reduce coupling, the coupling can be controlled with a designed structure, i.e., the distance between the busbars 132, 134. As shown in FIG. 6, the aperture AP 620 of the IDT 130 can be adjusted with a range of apertures that tunes the coupling without introducing excessive loss, and other unwanted effects. For example, by reducing the aperture AP 620, or the distance between the busbars 132 and 134, the effective acoustic coupling between resonators can be reduced. In some implementations, the aperture AP 620 can be in a range of about 3 times the pitch to about 11 times the pitch of the IDT 130. The aperture AP 610 that is about 11 times the pitch of the IDT 130 may correspond to a coupling ($k_{eff}^2$) of about 25%. In an aspect, by reducing the aperture AP 610 to about 3.6 times the pitch of the IDT 130, the coupling ($k_{eff}^2$) can be reduced to about 21%.

Figure 7:
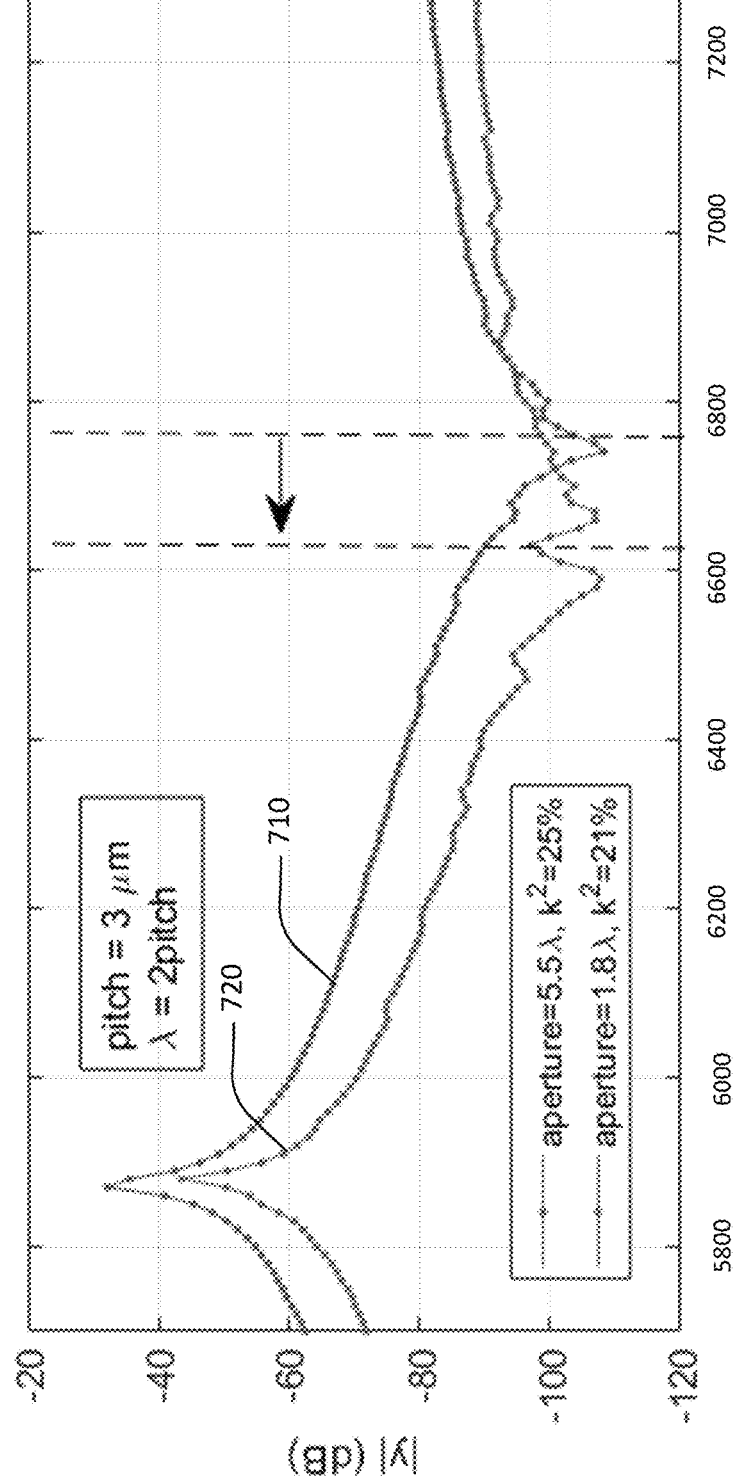
FIG. 7 is an illustration of a graph depicting a frequency response of an XBAR with different apertures.

FIG. 7 is an illustration of a graph 700 depicting a frequency response of an XBAR with different apertures. More specifically, the resonance characteristics (bandpass characteristics) of an acoustic resonator with different apertures are shown in FIG. 7. The frequency response may be in terms of the insertion loss over frequency. As illustrated in FIG. 7, the graph 700 includes a first waveform 710 representing a first frequency response of an acoustic resonator with an aperture of about 5.5λ, or about 11 times the pitch of the IDT 130 (i.e., about 33 μm), and a second waveform 720 representing a second frequency response of an acoustic resonator with an aperture of about 1.8λ, or about 3.6 times the pitch of the IDT 130 (i.e., about 10.8 μm). The acoustic resonator having its aperture at about 11 times the pitch has a coupling of about 25%, whereas the acoustic resonator having its aperture at about 3.6 times the pitch has a coupling of about 21%. As illustrated in FIG. 7, by reducing the aperture of the acoustic resonator from about 5.5λ to about 1.8λ, a decrease in the acoustic coupling can be realized. In this regard, the decrease in the coupling allows for filter designs with smaller apertures to be used for high-frequency applications, including n79 band and 5 GHz Wi-Fi applications.

Figure 8:
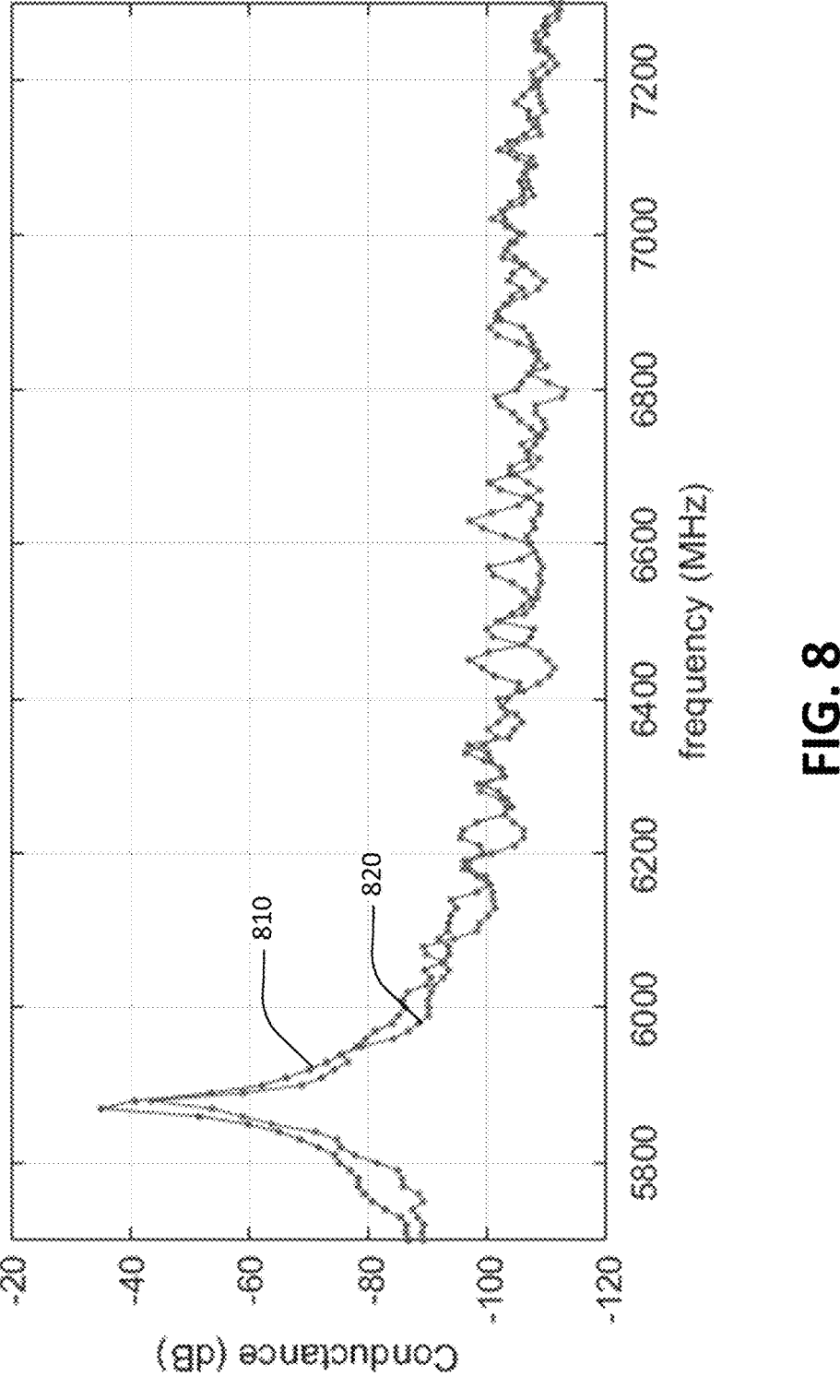
FIG. 8 is an illustration of a graph depicting conductance over a frequency response of an XBAR with different apertures.

FIG. 8 is an illustration of a graph 800 depicting conductance over a frequency response of an XBAR with different apertures. The frequency response may be in terms of the conductance over frequency. As illustrated in FIG. 8, the graph 800 includes a first waveform 810 representing a first frequency response of an acoustic resonator with a first aperture, and a second waveform 820 representing a second frequency response of an acoustic resonator with a second aperture. For purposes of brevity and explanation, the first aperture represents a larger aperture, or larger distance between busbars, than the second aperture. In some aspects, coupling can be decreased by decreasing the aperture, which adds parallel capacitance. However, as illustrated in FIG. 8, the difference in conductance between the first waveform 810 and the second waveform 820 appears relatively insignificant across the frequency response. In this regard, the conductance and loss are not significantly sacrificed at the narrower aperture.

The aspects described herein additionally include one or more of the following implementation examples described in the following numbered clauses.

Clause 1. An acoustic resonator device that a substrate; a rotated YX-cut piezoelectric plate coupled to the substrate and including a diaphragm that spans a cavity; and an interdigital transducer (IDT) including interleaved fingers at the diaphragm of the rotated YX-cut piezoelectric plate, wherein the IDT has an aperture that is less than or equal to 4 times a pitch of the interleaved fingers.

Clause 2. The acoustic resonator device of Clause 1, wherein the aperture is in a range of 3.6 times the pitch of the interleaved fingers to 11 times the pitch of the interleaved fingers.

Clause 3. The acoustic resonator device of any of Clause 1 or Clause 2, wherein the aperture of the acoustic resonator device is in a range of a first aperture and a second aperture that is less than or equal to 4 times the pitch of the interleaved fingers, wherein the first aperture corresponds to a first effective acoustic coupling and the second aperture corresponds to a second effective acoustic coupling that is greater than the first effective acoustic coupling.

Clause 4. The acoustic resonator device of any of Clauses 1-3, wherein the IDT comprises a pair of busbars facing each other with a plurality of interleaved fingers extending from each respective busbar, and wherein the aperture of the IDT is a distance of an overlap between the respective fingers extending from each of the pair of busbars in a direction perpendicular to a surface of the respective busbars from which the interleaved fingers extends.

Clause 5. The acoustic resonator device of any of Clauses 1-4, wherein the rotated YX-cut piezoelectric plate comprises 120-yx cut lithium niobate.

Clause 6. The acoustic resonator device of any of Clauses 1-4, wherein the rotated YX-cut piezoelectric plate comprises 128-yx cut lithium niobate.

Clause 7. The acoustic resonator device of any of Clauses 1-6, wherein the aperture is in a range of 10.8 μm to 33 μm.

Clause 8. A filter includes a substrate having a surface; a Y-rotated piezoelectric plate attached to the surface of the substrate except for a portion of the Y-rotated piezoelectric plate the comprises a diaphragm that spans a cavity in the substrate; and an interdigital transducer (IDT) including interleaved fingers at the diaphragm of the rotated Y-rotated piezoelectric plate, the IDT having an aperture that is less than or equal to 4 times a pitch of the interleaved fingers.

Clause 9. The filter of Clause 8, wherein the aperture is in a range of 3.6 times the pitch of the interleaved fingers to 11 times the pitch of the interleaved fingers.

Clause 10. The filter of any of Clause 8 or Clause 9, wherein the aperture of the acoustic resonator device is in a range of a first aperture and a second aperture that is less than or equal to 4 times the pitch of the interleaved fingers, wherein the first aperture corresponds to a first effective acoustic coupling and the second aperture corresponds to a second effective acoustic coupling that is greater than the first effective acoustic coupling.

Clause 11. The filter of any of Clauses 8-10, wherein the IDT comprises a pair of busbars facing each other with a plurality of interleaved fingers extending from each respective busbar, and wherein the aperture of the IDT is a distance of an overlap between the respective fingers extending from each of the pair of busbars in a direction perpendicular to a surface of the respective busbars from which the interleaved fingers extends.

Clause 12. The filter of any of Clauses 8-11, wherein the rotated YX-cut piezoelectric plate comprises 120-yx cut lithium niobate.

Clause 13. The filter of any of Clauses 8-11, wherein the rotated YX-cut piezoelectric plate comprises 128-yx cut lithium niobate.

Clause 14. The filter of any of Clauses 8-13, wherein the aperture is in a range of 10.8 μm to 33 μm.

Clause 15. A filter includes a substrate; a rotated YX-cut piezoelectric plate attached to at least a portion of a surface of the substrate; and an interdigital transducer (IDT) comprising interleaved fingers at at least a portion of the rotated YX-cut piezoelectric plate that spans a cavity between the rotated YX-cut piezoelectric plate and the substrate, the IDT having a distance between a plurality of busbars of the IDT that is less than or equal to 4 times a pitch of the interleaved fingers.

Clause 16. The filter of Clause 15, wherein the distance between the plurality of busbars is in a range of 3.6 times the pitch of the interleaved fingers to 11 times the pitch of the interleaved fingers.

Clause 17. The filter of Clause 15 or Clause 16, wherein the distance between the plurality of busbars is in a range of a first distance and a second distance that is less than or equal to 4 times the pitch of the interleaved fingers, wherein the first distance corresponds to a first effective acoustic coupling and the second distance corresponds to a second effective acoustic coupling that is greater than the first effective acoustic coupling.

Clause 18. The filter of any of Clauses 15-17, wherein the rotated YX-cut piezoelectric plate comprises 120-yx cut lithium niobate.

Clause 19. The filter of any of Clauses 15-17, wherein the rotated YX-cut piezoelectric plate comprises 128-yx cut lithium niobate.

Clause 20. The filter of any of Clauses 15-19, wherein the distance between the plurality of busbars is in a range of 10.8 μm to 33 μm.

In general, it is noted that throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back". As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:
1. An acoustic resonator device, comprising:
a substrate;

a rotated YX-cut piezoelectric layer coupled to the substrate and including a diaphragm that is over a cavity; and an interdigital transducer (IDT) including interleaved fingers at the diaphragm of the rotated YX-cut piezoelectric layer, wherein the IDT has an aperture that is in a range between 10.8 μm and 33 μm, and wherein the IDT has a pitch that is between 2 and 20 times a width of the interleaved fingers.

2. The acoustic resonator device of claim 1, wherein the aperture is approximately 3.6 times the pitch of the interleaved fingers.

3. The acoustic resonator device of claim 1, wherein the aperture of the IDT is in a range between a first aperture and a second aperture that is less than or equal to 4 times the pitch of the interleaved fingers, and wherein the first aperture corresponds to a first effective acoustic coupling and the second aperture corresponds to a second effective acoustic coupling that is greater than the first effective acoustic coupling.

4. The acoustic resonator device of claim 1, wherein the IDT comprises a pair of busbars facing each other with a plurality of interleaved fingers extending from each respective busbar, and wherein the aperture of the IDT is a distance of an overlap between the respective fingers extending from each of the pair of busbars in a direction perpendicular to a surface of the respective busbars from which the interleaved fingers extends.

5. The acoustic resonator device of claim 1, wherein the rotated YX-cut piezoelectric layer comprises 120-yx cut lithium niobate.

6. The acoustic resonator device of claim 1, wherein the rotated YX-cut piezoelectric layer comprises 128-yx cut lithium niobate.

7. The acoustic resonator device of claim 1, wherein the pitch of the IDT is one-half of an acoustic wavelength at a resonance frequency of the acoustic resonator device.

8. A filter, comprising:

a substrate having a surface;

a Y-rotated piezoelectric layer attached to the surface of the substrate except for a portion of the Y-rotated piezoelectric layer that comprises a diaphragm that spans a cavity; and an interdigital transducer (IDT) including interleaved fingers at the diaphragm of the rotated Y-rotated piezoelectric layer, wherein the IDT has an aperture that is in a range between 10.8 μm and 33 μm, and wherein the IDT has a pitch that is between 2 and 20 times a width of the interleaved fingers.

9. The filter of claim 8, wherein the aperture is approximately 3.6 times the pitch of the interleaved fingers.

10. The filter of claim 8, wherein the aperture of the filter is in a range between a first aperture and a second aperture that is less than or equal to 4 times the pitch of the interleaved fingers, and wherein the first aperture corresponds to a first effective acoustic coupling and the second aperture corresponds to a second effective acoustic coupling that is greater than the first effective acoustic coupling.

11. The filter of claim 8, wherein the IDT comprises a pair of busbars facing each other with a plurality of interleaved fingers extending from each respective busbar, and wherein the aperture of the IDT is a distance of an overlap between the respective fingers extending from each of the pair of busbars in a direction perpendicular to a surface of the respective busbars from which the interleaved fingers extends.

12. The filter of claim 8, wherein the Y-rotated piezoelectric layer comprises 120-yx cut lithium niobate.

13. The filter of claim 8, wherein the Y-rotated piezoelectric layer comprises 128-yx cut lithium niobate.

14. A filter, comprising:

a substrate;

a rotated YX-cut piezoelectric layer attached to at least a portion of a surface of the substrate; and an interdigital transducer (IDT) comprising interleaved fingers on at least a portion of the rotated YX-cut piezoelectric layer that spans a cavity between the rotated YX-cut piezoelectric layer and the substrate, wherein the IDT has a distance between a plurality of busbars that is in a range of 10.8 μm to 33 μm.

15. The filter of claim 14, wherein the distance between the plurality of busbars is approximately 3.6 times the pitch of the interleaved fingers.

16. The filter of claim 14, wherein the distance between the plurality of busbars is in a range between a first distance and a second distance that is less than or equal to 4 times the pitch of the interleaved fingers, and wherein the first distance corresponds to a first effective acoustic coupling and the second distance corresponds to a second effective acoustic coupling that is greater than the first effective acoustic coupling.

17. The filter of claim 14, wherein the rotated YX-cut piezoelectric layer comprises 120-yx cut lithium niobate.

18. The filter of claim 14, wherein the rotated YX-cut piezoelectric layer comprises 128-yx cut lithium niobate.

* * * * *